United States Patent [19]

Harvey

[11] Patent Number: 5,621,298
[45] Date of Patent: Apr. 15, 1997

[54] POWER SUPPLY WITH AUTOMATIC CHARGE MEASURING CAPABILITY

[75] Inventor: Bruce G. Harvey, St. Charles, Mo.

[73] Assignee: Motor Appliance Corporation, St. Louis, Mo.

[21] Appl. No.: 319,281

[22] Filed: Oct. 6, 1994

[51] Int. Cl.$^6$ .............................. H01M 10/44; H02J 7/04
[52] U.S. Cl. .................... 320/5; 320/14; 320/30
[58] Field of Search ............................. 320/5, 11, 22, 320/39, 43, 44, 48; 324/426, 427

[56] References Cited

U.S. PATENT DOCUMENTS

| | | | |
|---|---|---|---|
| 4,709,202 | 11/1987 | Koenck | 320/43 |
| 4,965,738 | 10/1990 | Bauer et al. | 364/483 |
| 5,463,305 | 10/1995 | Koenck | 320/21 |
| 5,493,199 | 2/1996 | Koenck et al. | 320/35 |
| 5,508,599 | 4/1996 | Koenck | 320/21 |
| 5,514,946 | 5/1996 | Lin et al. | 320/31 |

OTHER PUBLICATIONS

A Better Way To Test Your Batteries., USA Midtronics, Inc., two pages.
A Better Way To Test Your Cells & Batteries., USA Midtronics, Inc., two pages.
ERB–C Rackmount Battery Chargers, National Railway Supply, Inc., two pages, Oct. 1993.
Microprocessor Rectifier Battery Charger, The Battery Man, pp. 30–31, Feb. 1994.
Model TCVS Temperature Compensated Battery Charger, Railway Equipment Co., two pages.
New From Exide, The Exide MRC Microprocessor Controlled Charger With Temperature Compensation.
Our Customers Wanted A Battery Charger For Their Rail Signal And Communicatin Batteries that Had: . . . , National Railway Supply, Inc., three pages, Sep. 1993.
Section 5–05 Model GGS Stationary Battery Charger, GNB Battery Technologies, four pages, Revised May 1993.

Primary Examiner—Peter S. Wong
Assistant Examiner—Gregory Toatley
Attorney, Agent, or Firm—Howell & Haferkamp, L.C.

[57] ABSTRACT

A power supply having a battery and a battery charger is disclosed which includes a discharge circuit for automatically measuring the battery charge without taking the battery out of service and without draining the battery below the minimum safe charge level necessary to operate a piece of equipment connected thereto. The discharge circuit automatically electrically isolates the battery from the charging circuit and measures the battery characteristics as the battery discharges across the equipment load. Once the battery charge is measured, the results are stored in non-volatile memory and the battery is automatically recharged.

18 Claims, 5 Drawing Sheets

POWER SUPPLY WITH AUTOMATIC CHARGE MEASURING CAPABILITY

BACKGROUND AND SUMMARY OF THE INVENTION

Safety equipment such as fire alarms, severe weather warning devices, roadway hazard signs, and railroad safety equipment (i.e., traffic control, grade-crossing protection, and fault detection devices) each require a power source which will drive the equipment even in the event utility power is lost. A typical prior art power supply utilizes a battery and a charging circuit linked to the local utility power line to maintain a near constant battery voltage. When the battery is new, the amount of stored energy is well known. However, as the battery ages, it is capable of holding less and less energy, and will eventually fail to meet the minimum standard for a safe and reliable power source. Because an undercharged battery in these power supplies can have fatal consequences by rendering the safety equipment inoperative if utility power fails, it is vital to periodically measure the stored electrical energy in these batteries and to replace the batteries before the minimum safe energy level is reached.

While voltage readings are helpful in determining weak battery cells in a poorly performing battery, measuring voltage alone is an unreliable charge indicator because battery cells may have a nearly constant voltage over a wide range of charge states. Several techniques are known in the art for measuring the state of charge in a battery. One of these techniques measures the specific gravity of the battery electrolyte. With rechargeable batteries (typically using an electrolyte of sulfuric acid and water), the chemical reaction accompanying the battery discharge creates water, reducing its specific gravity. The specific gravity of a fully charged cell is typically 1.300 and the voltage is typically 2 volts–2.4 volts. However, measuring the specific gravity requires access to the battery electrolyte. With older batteries, the electrolyte is in liquid form and the cell is covered by a removable cap. Removing the cap and measuring the specific gravity with the aid of a hydrometer is a common procedure. However, newer batteries use an electrolyte in gel form which is housed in a sealed fiberglass enclosure making it very difficult to measure the electrolyte's specific gravity. Thus, measuring the specific gravity is less feasible for determining battery charge in present field applications.

Another technique for measuring the charge of a battery includes removing the battery from service and connecting it to a charge tester which measures the charge by draining the battery well below the minimum safe energy level (typically 1.75 volts/cell). Because the battery is nearly discharged at this point, the battery must be recharged before being returned to service. This is the preferred technique in the prior art for determining if the battery can retain a minimum safe charge level.

Among other problems, the above prior art technique is expensive, time consuming, and often hazardous. In industries such as the railroad industry where thousands of power supplies are scattered over thousands of miles, many in remote and hard to reach areas, dispatching a crew to these locations is, in itself, quite expensive. A typical Class I railroad may have a power supply for traffic control, grade crossings, and/or fault protection devices every 1–4 miles over twenty thousand (20,000) miles or more of right of way. Once the crew reaches a given power supply, a temporary replacement battery must be installed, and the targeted battery must be tested. While the prior art technique typically drains the battery across a load 2–3 times the designed equipment load (in order to minimize testing time) it takes on average 8 to 12 hours to drain the battery down to 1.75 volts/cell. Moreover, because the battery is drained well below the minimum safe energy level, it must be recharged before being returned to the power supply—which takes an additional several hours.

As demonstrated, this prior art technique is time consuming and highly labor intensive which often requires multiple trips to very remote locations in order to test and properly recharge a battery. In fact, the test is so labor intensive and costly, that the required frequency of testing simply is not performed in many cases. This is especially true with geographically remote power supplies. The result of infrequent testing (or no testing at all in some instances) is an increased rate of battery failure during utility power outages thereby exposing the public and railroad crews to undesired and avoidable safety risks.

Another drawback to this prior art technique is the danger associated with accelerated discharging and charging of aging batteries. As mentioned above, to reduce the time necessary to test these batteries the prior art charge testing equipment utilizes a load 2–3 times the equipment load which the battery is designed to drive, thereby accelerating the battery discharge. The battery is likewise recharged at an accelerated rate. The increased current associated with accelerated discharging and charging tends to increase the temperature of any loose internal electrical connections and conduit thereby increasing the risk of battery explosions and the dangers associated therewith.

In order to overcome these and other problems in the prior art, the inventors herein have succeeded in designing and developing a power supply which can automatically measure a battery charge level without removing the battery from service and without accelerated battery discharging and recharging. In its simplest form, the power supply of the present invention includes a battery connected between an input power source and an equipment set, with a silicon controlled rectifier (SCR) controlled by a control circuit for switching the input power source off to test the battery. A battery voltage sensor and load current sensor are also connected to the control circuit to monitor the battery during testing. To measure the battery charge, the control circuit switches off the SCR thereby disconnecting the input power and causing the battery to discharge across the known equipment load until a minimum discharge voltage or a maximum discharge time is reached. At the end of the discharge mode, the control circuit automatically recharges the battery in an "equalized mode" and then maintains the battery at a programmed voltage level during a "float mode".

By selecting the minimum discharge voltage and maximum discharge time such that the battery charge is only partly drained during the discharge mode, the present invention avoids draining the battery below the minimum safe charge level such that it is always capable of responding to an emergency—even immediately after the test is complete. Therefore, the battery need not be taken out of service in order to measure the available charge which results in significant cost and labor savings. Moreover, because the discharge mode of the present invention does not increase the discharge load above that provided by the equipment which the power supply is designed to power, accelerated battery discharge is avoided. Likewise, the increased risk of explosion associated therewith is also avoided.

While in the discharge mode, the control circuit continuously monitors the battery voltage, ampere-hours drained from the battery, and the elapsed discharge time. When either the programmed maximum elapsed discharge time or programmed minimum discharge voltage is reached, the discharge parameters are recorded in non-volatile memory. As the battery charge is related to the time necessary for the known equipment load to drain the battery, a decrease in the time necessary to reach the minimum discharge voltage over the course of several discharge tests indicates a corresponding decrease in available battery charge. Thus, by tracking the discharge parameters (voltage, time, and ampere-hours discharged) the appropriate time to replace the battery is predictable.

Measuring the battery charge within the power supply of the present invention may be simply initiated by pressing an appropriate button or inputting an appropriate code to the control circuit. An operator may then return to the unit at a convenient time in the future to read the discharge parameters. This may be accomplished in a matter of minutes as opposed to the several hours (or even days) required in the prior art to remove the battery from service, install a temporary replacement battery, manually connect the targeted battery to a stand-alone testing unit, drain the battery, recharge the battery, and return it to service. With the present invention, once the discharge mode is initiated, the battery charge is tested and recharged automatically making it much more likely that the units will be regularly tested thereby providing greater assurance that the above mentioned safety devices will function properly in the event of a power outage.

Moreover, the control circuit may be programmed to automatically initiate the discharge mode at given time increments thereby further eliminating the need to dispatch a crew to manually perform this task. The power supply of the present invention may also include a transmitter and receiver to facilitate remote initiation of the discharge mode and remote retrieval of the discharge parameters thereby further reducing the labor associated with dispatching crews to remote locations.

Thus, the present invention satisfies a long-felt need by providing a power supply with automatic battery charge testing capability which is safe and simple to operate. While the principal advantages and features of the present invention have been briefly described above, a more thorough understanding and appreciation for the advantages and features of the invention may be attained by referring to the drawings and descriptions of the preferred embodiment which follow.

DESCRIPTION OF THE PREFERRED EMBODIMENT

Figure 1:
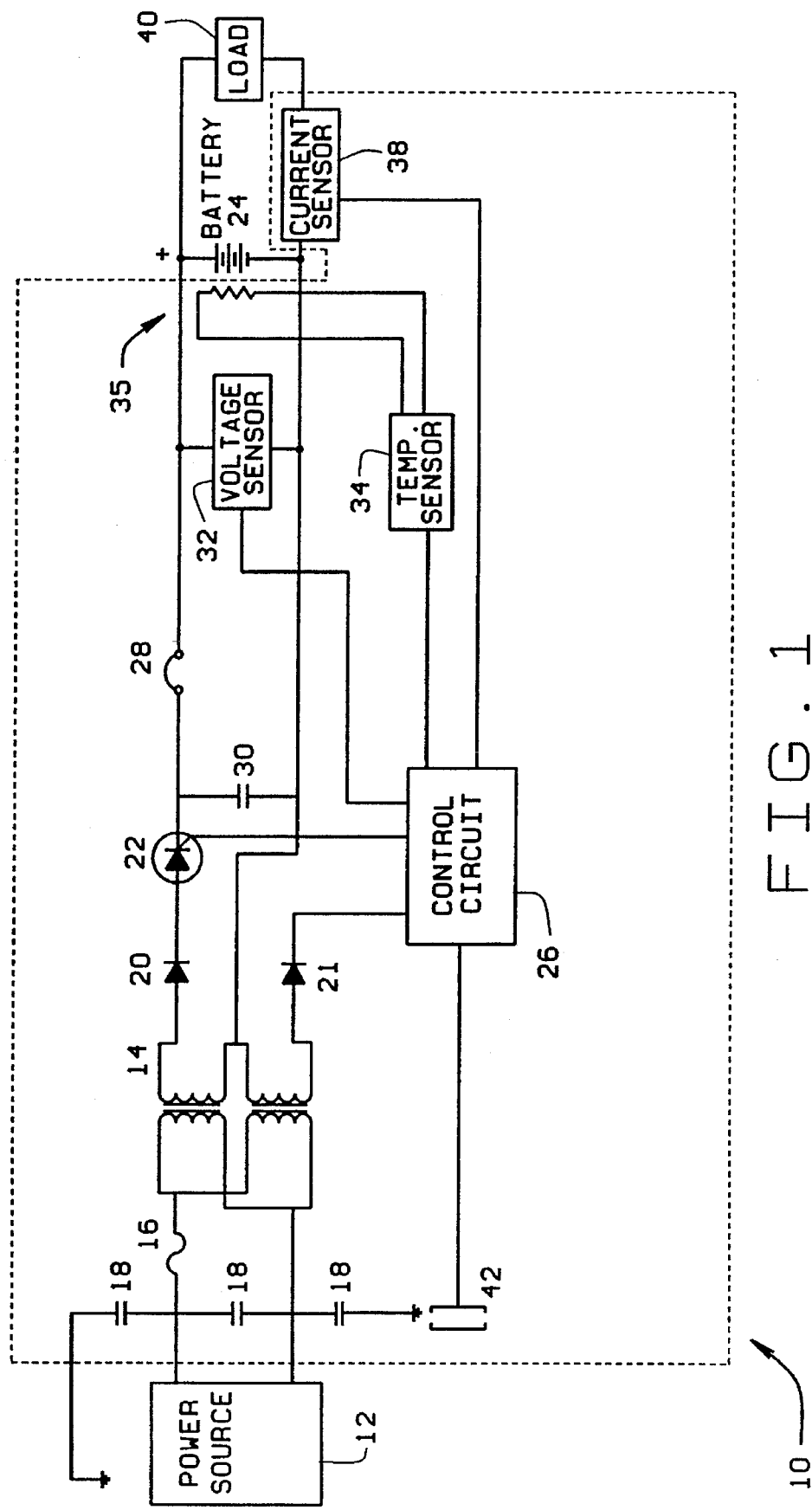
FIG. 1 is a schematic diagram depicting a power supply of the present invention having a battery, a battery charging circuit connected to an input power source, and a discharge circuit for automatically measuring the battery charge.

A power supply 10 constructed according to the principles of the present invention is illustrated schematically in FIG. 1. A power source 12, typically A.C. line power provided by a local utility, is connected to a main transformer 14 through a 15 amp/250 volt fuse 16. Several 350 VAC metal oxide varistors 18 connected line-to-line and line-to-ground protect the power supply 10 from line surges. The transformer 14 is preferably an M-6 magnetic steel core (ferroresonant configuration) with dual primary windings, a center tapped secondary winding, and a pair of magnetic shunts providing a path for loss of part of the magnetic flux thereby making the transformer current limiting. FIG. 1 shows the transformer 14 wired for a 120 VAC supply voltage. The transformer may also be wired for a 240 VAC supply voltage as is well known in the art. It is understood that the power source 12 is not limited to A.C. utility power but may be provided by solar panels, or other suitable means.

Two rectifiers 20 and 21 are connected to the positive and negative terminals of the transformer secondary windings, respectively. The rectifier 20 is connected in series with an SCR 22 and the positive terminal of a battery 24, the battery 24 being protected by a circuit breaker 28 and a 150 VAC metal oxide varistor 30. The rectifier 21 is connected to a control circuit 26 which in turn controls the electronic switching characteristics of the SCR 22.

A voltage sensor 32 is connected in parallel with the battery terminals, a temperature sensor 34 is connected to a thermistor 35 which is located in close physical proximity to the battery 24, and a current sensor 38 is serially connected with a known load 40. The preferred embodiment utilizes the equipment load (grade crossing protection equipment, traffic control equipment, etc.) which the power supply 10 is designed to drive as the known load 40. However, it is understood that another load may be selectively coupled to the battery 24 by relay contacts, electronic switches, or other suitable means. The voltage sensor 32, temperature sensor 34, current sensor 38, and an input/output terminal 42 are each connected to the control circuit 26.

Figure 2:
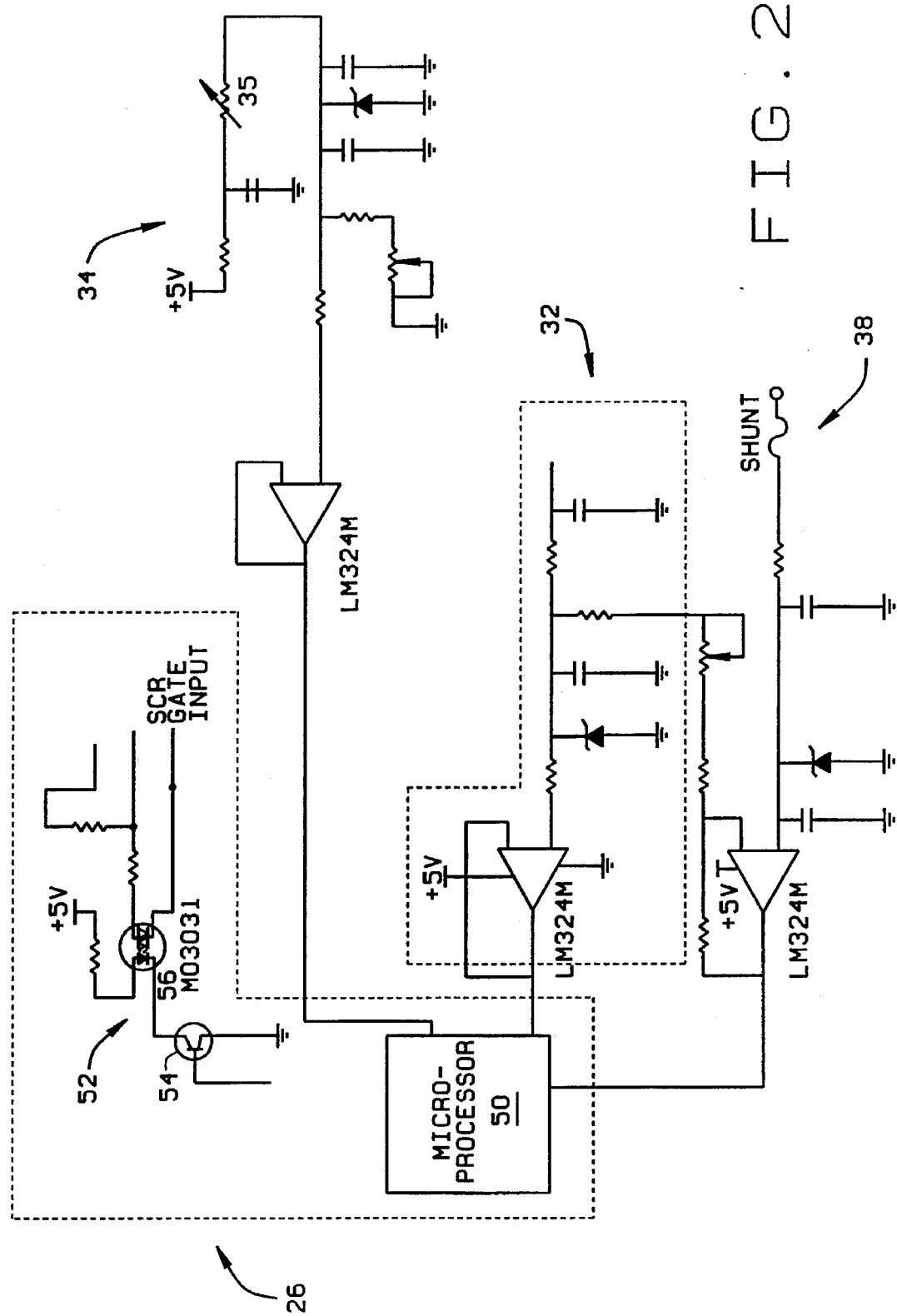
FIG. 2 is a schematic illustrating in greater detail the control circuit, temperature sensor, voltage sensor, and current sensor of the present invention.
Figure 3:
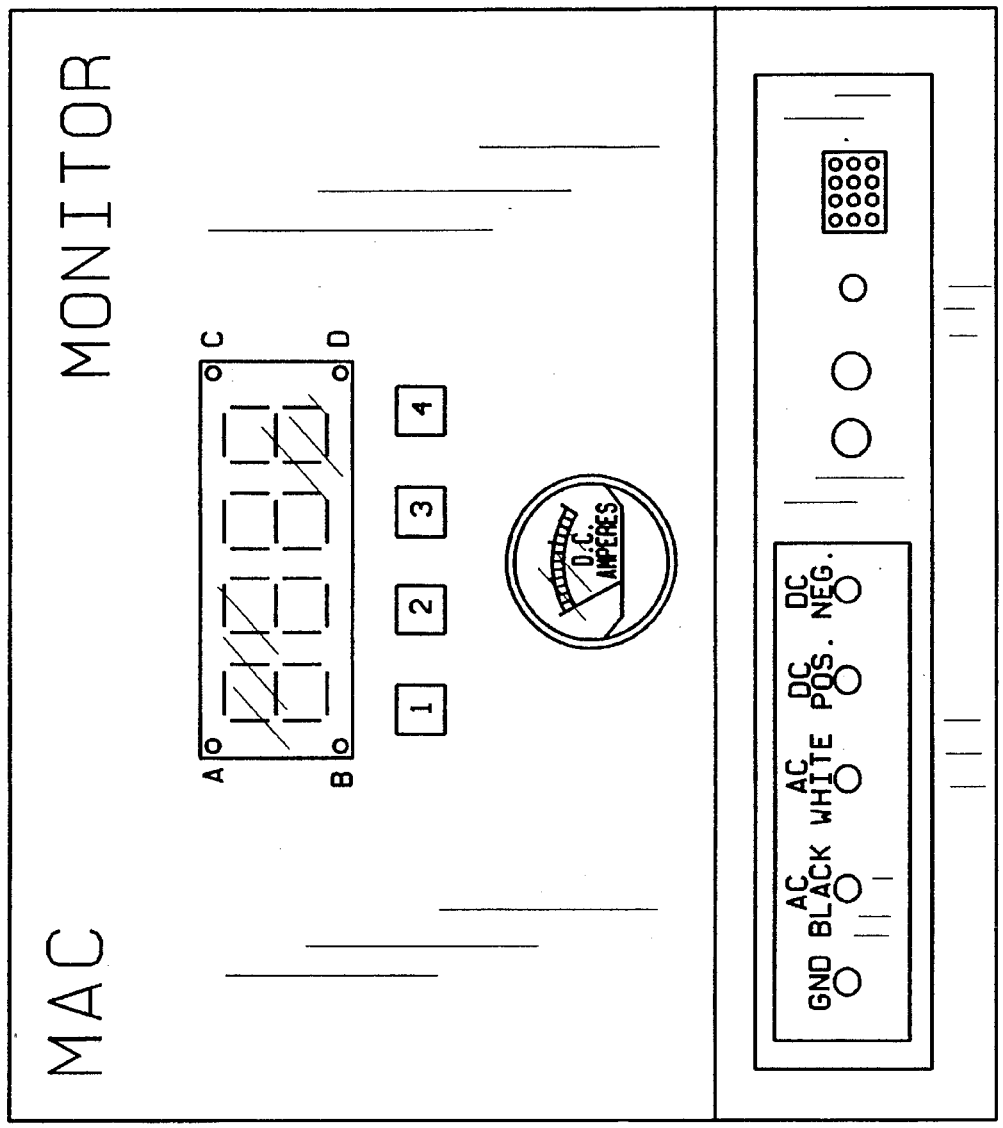
FIG. 3 is an illustration of the front cover of the housing of the present invention showing four push buttons, a four character display, and four LEDs.

FIG. 2 illustrates the control circuit 26, voltage sensor 32, temperature sensor 34, and current sensor 38 in greater detail. The control circuit 26 includes a microprocessor 50 and an SCR firing circuit 52. The microprocessor is preferably a Motorola 68HC705B16 running at a clock speed of 4 Mhz. A Motorola MC34164P5 voltage monitor (not shown) is preferably used to provide power on reset and low supply voltage protection for the microprocessor 50. The SCR firing circuit 52 includes a transistor 54 connected between the microprocessor 50 and a zero crossing opto-coupler 56 which in turn is connected to the gate of SCR 22. In the preferred embodiment, the transistor 54 is a Motorola 2N3906 and the opto-coupler 56 is a Motorola MOC3031, respectively. As is well known in the art, the SCR 22 is an electronic switch which may be "opened" and "closed" by manipulating the gate current thereto. Therefore, the control circuit 26 is able to control when the battery is connected to the input power by regulating the SCR gate current.

The voltage sensor 32 preferably employs an LM324N operational amplifier manufactured by Motorola, and other well-known components. The current sensor 38 includes a 50 mv/50 amp DC shunt in the negative battery line which is filtered and applied to the input of an LM324N operational amplifier (manufactured by Motorola) configured as a 42:1 voltage multiplier. The temperature sensor 34 is preferably a 100 KΩ thermistor in combination with a voltage divider where voltage increases as temperature increases. In the preferred embodiment, the divider output is applied through an LM324N operational amplifier configuration as a voltage follower with a 1.5 volt output at 77° F.

Several modes of operation are available with the power supply of the present invention and each is described separately below:

1. Float Mode

The float mode is the mode of operation most often employed by the power supply 10 and is initialized by establishing a float voltage (i.e., 2.3 volts/cell). The voltage sensor 32 continuously monitors the voltage across battery 24. When the battery voltage drops below the float voltage, the control circuit 26 activates the SCR switch 22 thereby connecting the battery to the power source 12 and charging the battery. Once the battery reaches the float voltage, the SCR switch is turned off until the battery voltage again drops below the float voltage.

2. Equalize Mode

The equalize mode is entered when the battery requires a more constant charge to re-energize the battery. For example, the equalize mode is initiated at the conclusion of the discharge mode, which is described below. An equalize voltage which is higher than the float voltage (typically 2.4 volts/cell) and an equalize time period (12 hours in the preferred embodiment) are initialized. Upon entering the equalize mode, the control circuit 26 activates the SCR switch 22 thereby connecting the battery 24 to the power source 12 and beginning an extended charging cycle. If the battery reaches the equalize voltage prior to expiration of the equalize time period, the system begins to "float" at the equalize voltage until the equalize time period expires, at which point the system will enter the float mode as described above. If the system has not reached the equalize voltage prior to the equalize time period expiring, the system will enter the float mode as described above upon expiration of the equalize time period.

3. Discharge Mode

In the discharge mode, or test mode, the system measures the available battery charge by first accepting discharge initialize data—minimum discharge voltage and maximum hours of discharge (typically 1.9 volts/cell and 15–20 hours). The control circuit 26 discontinues battery charging by assuring that the SCR switch is open, and the battery begins to discharge across the load 40 without being recharged. The microprocessor continually monitors the battery voltage, ampere-hours drained from the battery, and the elapsed discharge time. When the battery voltage reaches the pre-programmed minimum discharge voltage, the microprocessor records in non-volatile memory the elapsed time, minimum voltage, and ampere-hours drained from the battery during the discharge mode. Note, it is expected with new batteries that the maximum hours of discharge will be reached before the minimum discharge voltage. At the conclusion of the discharge mode, the system enters the equalize mode for 12 hours and then returns to the float mode.

Because the battery charge is a function of the time necessary for the load 40 to drain the battery, a decrease in the time necessary to reach the minimum discharge voltage signals a decrease in the available battery charge. Thus, by tracking the discharge parameters (voltage, time, ampere-hours discharged) an operator can conveniently project the appropriate time to replace the battery.

In the preferred embodiment, the minimum discharge voltage and maximum hours discharged are selected such that the battery charge is only partially emptied during the discharge mode and the battery 24 never drops below the established minimum safe charge level needed to drive the equipment 44. While the minimum safe charge level may vary depending on the power demand of the equipment a given power supply is designed for, "minimum safe charge" as used herein shall refer to the battery charge necessary to drive a given piece of equipment under typical operating parameters for a reasonable time period (typically 2 days) without needing to be recharged. By avoiding too severe a power drain, the battery is capable of responding to an emergency (driving the equipment if utility power fails) even immediately after the discharge mode is complete. Therefore, contrary to the prior art, the battery 24 need not be taken out of service in order to measure its charge—resulting in significant cost and labor savings. The system 10 may also include a transmitter/receiver to allow remote activation, recording, and comparison of data thereby completely eliminating the need for a physical site visit until the time arrives to change the power supply battery.

The power supply 10 is housed in a 16-gauge steel case with a typical cover as illustrated in FIG. 4. The cover includes four buttons labeled stop, equalize set, program, and select. In the preferred embodiment, the input/output terminal 42 connects the control circuit 26 to the four push buttons, the four character display panel, and the four LEDs labeled "A" through "D" around the perimeter of the display panel as illustrated in FIG. 4.

Figure 4A:
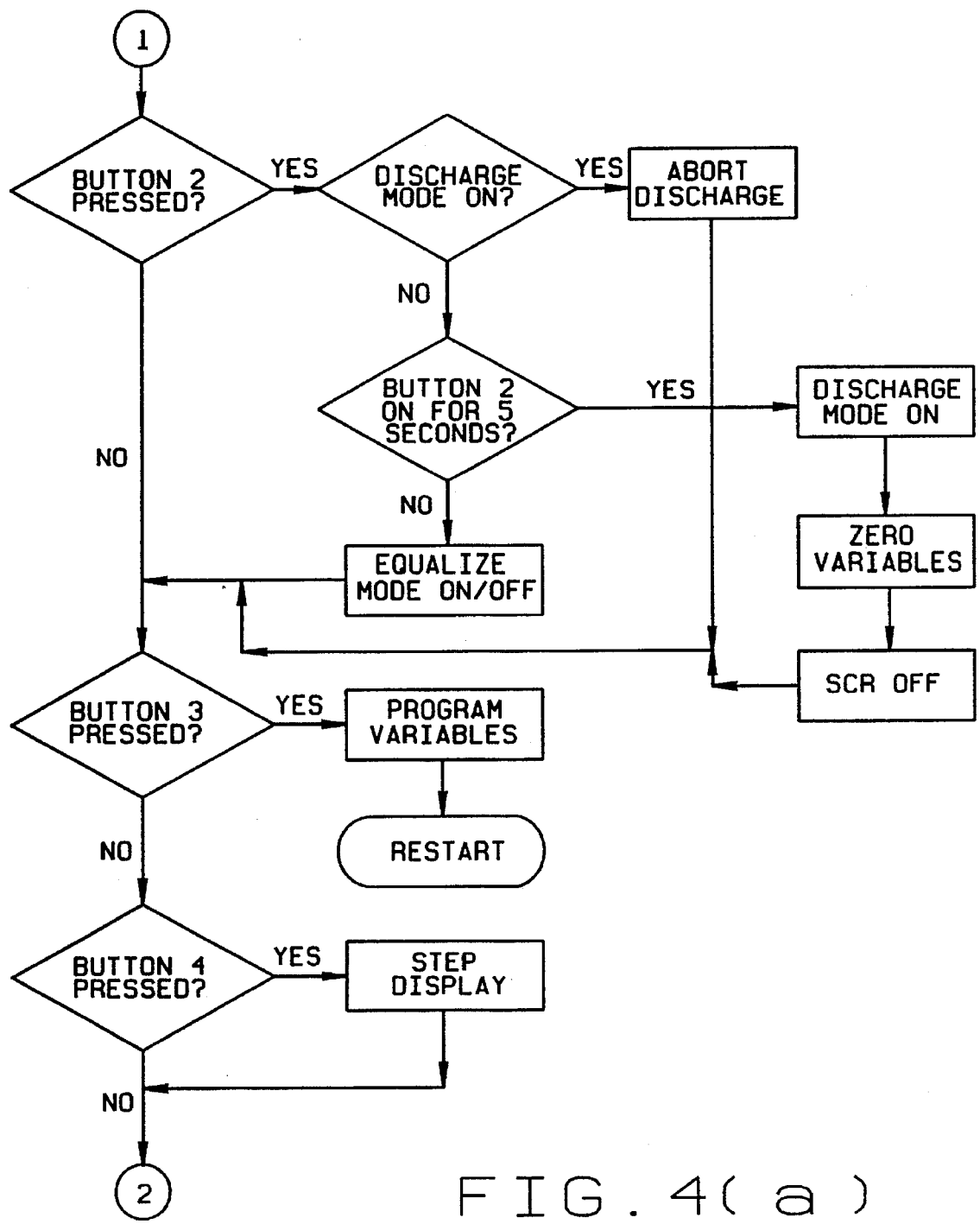
FIGS. 4a and 4b is a flow chart of the software for the microprocessor illustrating the various modes of operation of the present invention.
Figure 4B:
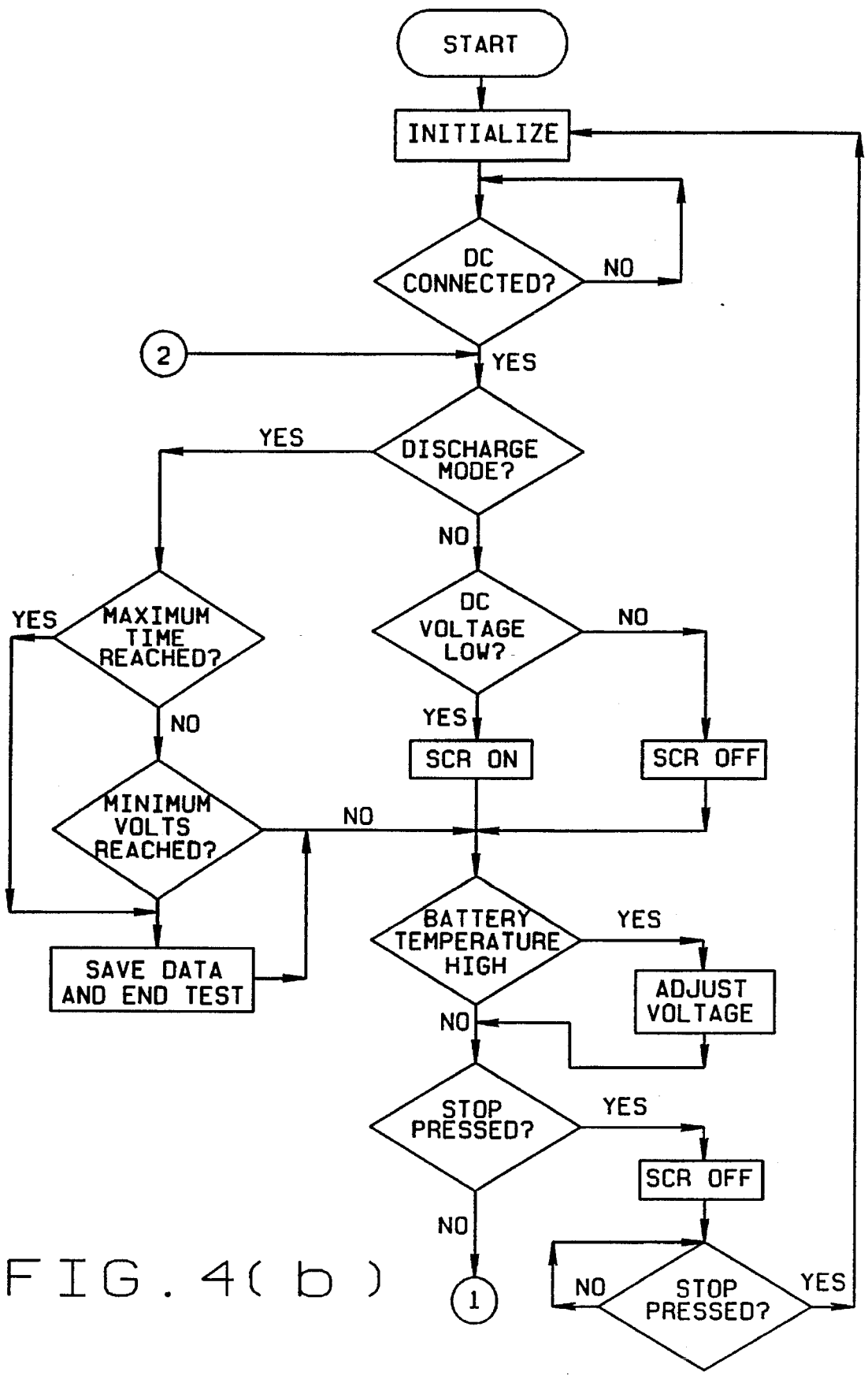

Referring to FIGS. 4a and 4b, the software implementing the various modes of operation in the preferred embodiment is described below. When first activated, the system 10 must be initialized. A number of different parameters are input into the microprocessor 50 via input/output terminal 42, or another suitable means. In this preferred embodiment, the number of battery cells, float voltage, equalize voltage, days between equalize charge, minimum discharge voltage, and maximum hours of discharge are required to initialize the system. While the preferred embodiment manually initializes each parameter it is understood that the system 10 may include default values for one or more initialized parameters. Once initialized, the microprocessor 50 uses the voltage sensor 32 to recognize when the battery 24 is properly connected, and then begins the sequential operating procedure as illustrated.

The system first checks to see if the discharge mode is activated. The discharge mode may be activated remotely, by a timer, or as in the prior art, by pressing and holding the equalize set button for five seconds. In the discharge mode, the microprocessor 50 checks whether the maximum discharge time has expired (typically 15–20 hours) and whether the minimum discharge voltage is reached (typically 1.9 volts/cell). If either the maximum discharge time or minimum discharge voltage is met, the microprocessor 50 saves the discharge mode data (discharge time, minimum discharge voltage, and ampere-hours discharged) in non-volatile memory and advances to check the battery temperature. If the discharge mode was not activated, the system defaults to the float mode wherein the microprocessor 50 compares the battery voltage with the initialized float voltage (typically 2.3 volts/cell). If the battery voltage is below the float voltage, an appropriate SCR gate signal is generated to turn the SCR "on". Otherwise, the SCR is turned (or remains) "off". The microprocessor 50 next checks the battery temperature. Regardless which mode the system is presently in (float, equalize, or discharge), if the battery temperature increases above a maximum safe level (typically 120° F.), the SCR is turned "off" to avoid overheating the system. Note, in the discharge mode, the SCR is always "off."

After checking the battery temperature, the microprocessor 50 sequentially checks whether the stop, equalize set, program, or select buttons are pressed. If the stop button is pressed, the system ceases operation and enters a dormant state until the stop button is again pressed and the system 10 is initialized. Pressing the equalize set button will abort the discharge mode if the system is presently in the discharge mode. If the discharge mode is not presently activated, holding the equalized set button for less than five seconds will begin the equalize mode. Depressing the equalize set button for five or more seconds activates the discharge mode by zeroing the results of the last discharged test (ampere-hours, minimum voltage, and discharge time) and turning the SCR "off".

Pressing the program button while the system is operating effectively ceases operation and restarts the program by requesting initialization parameters. Depressing the select button will display the results of the last discharge test. After checking whether any of the four buttons are pressed, the program loops back and again determines whether the discharge mode is activated.

There are various changes and modifications which may be made to the invention as would be apparent to those skilled in the art. However, these changes or modifications are included in the teaching of the disclosure, and it is intended that the invention be limited only by the scope of the claims appended hereto.

What is claimed is:

1. A battery charger for connection between an input power source and a battery, comprising:
   an equipment set providing a known load; and
   means for automatically measuring a charge in said battery as said batter and said equipment set remain connected to said input power source, said charge measuring means including means for electrically isolating said equipment set and said battery from said input power source to thereby partially discharge the battery through the equipment set, and means for thereafter automatically electrically reconnecting the equipment set and battery to said input power source to thereby recharge the battery, said recharging occurring before said battery is discharged below a level required to drive the equipment set.

2. The battery charger of claim 1 wherein said charge measuring means includes means for determining a plurality of discharge parameters as said battery is discharged, said discharge parameters being indicative of said battery charge.

3. The battery charger of claim 2 wherein said charge measuring means includes means for monitoring said discharge parameters and controlling said battery discharge in response thereto.

4. The battery charger of claim 3 wherein the electronic switch is connected between the power source and the battery to thereby electrically isolate said battery and said equipment set from said power source.

5. The battery charger of claim 3 wherein said discharge parameters include a minimum battery voltage.

6. The battery charger of claim 3 wherein said discharge parameters include a maximum discharge time.

7. The battery charger of claim 3 wherein said discharge parameters include ampere-hours discharged.

8. A method of automat measuring the charge of a battery as said battery remains connected to a batter charger, said battery also being connected to an equipment set, the method comprising the steps of:
   electrically isolating said battery from said battery charger to thereby partially discharge said battery into said equipment set;
   measuring one or more discharge parameters as said batter discharges;
   terminating said battery discharge prior to said battery reaching a minimum safe charge, including the step of automatically electrically connecting said battery to said battery charger before said battery is fully discharged to thereby recharge said battery.

9. The method according to claim 8 wherein the step of measuring said discharge parameters includes measuring a battery voltage.

10. The method according to claim 8 wherein the step of measuring said discharge parameters includes measuring discharge time.

11. The method according to claim 8 wherein the step of measuring said discharge parameters includes measuring ampere-hours discharged.

12. The method of claim 8 wherein the equipment set comprises a load selected from the group consisting of railroad traffic control equipment and railroad grade crossing protection equipment.

13. The method of claim 12 wherein the discharging step is remotely initiated via a transmitter and a receiver.

14. A battery charger for connection between an input power source and a battery having a voltage, the charger comprising:
   an equipment set drawing an operating current and electrically coupled to the battery;
   sensors electrically coupled to the battery for measuring the battery voltage and the operating current;
   a control circuit electrically coupled to the sensors to determine a plurality of discharge parameters, the control circuit also being operably coupled to the control input of the switch to open the switch to electrically isolate the input power source from the battery and to thereby discharge the battery through the equipment set without increasing a discharge load on the battery above that provided by the equipment set;
   wherein the equipment set remains coupled to the battery when the switch is closed.

15. The battery charger of claim 14 further comprising a battery temperature sensor thermally coupled to the battery and electrically coupled to the control circuit.

16. The battery charger of claim 14 wherein the equipment set comprises a device selected from a group consisting of railroad traffic control equipment and railroad grade crossing protection equipment.

17. A plurality of battery chargers of the type of claim 15 installed at distances of 1 to 4 miles along a railroad right of way.

18. The battery charger of claim 14 and further comprising a transmitter/receiver to remotely initiate discharging of the battery and to provide remote retrieval of parameters from the discharge parameter monitor.

* * * * *